(12) United States Patent
Huang et al.

(10) Patent No.: US 12,379,528 B2
(45) Date of Patent: Aug. 5, 2025

(54) ENCAPSULATION STRUCTURE, ENCAPSULATION METHOD, ELECTROLUMINESCENT DEVICE, AND DISPLAY DEVICE

(71) Applicant: BOE Technology Group Co., Ltd., Beijing (CN)

(72) Inventors: Qingyu Huang, Beijing (CN); Wenqi Liu, Beijing (CN); Fudong Chen, Beijing (CN); Zhiqiang Jiao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 672 days.

(21) Appl. No.: 17/782,775

(22) PCT Filed: May 20, 2021

(86) PCT No.: PCT/CN2021/094929
§ 371 (c)(1),
(2) Date: Jun. 6, 2022

(87) PCT Pub. No.: WO2021/238770
PCT Pub. Date: Dec. 2, 2021

(65) Prior Publication Data
US 2022/0407035 A1    Dec. 22, 2022

(30) Foreign Application Priority Data
May 26, 2020    (CN) .......................... 202010455274.5

(51) Int. Cl.
*G02B 5/00*    (2006.01)
*H10K 50/82*    (2023.01)
(Continued)

(52) U.S. Cl.
CPC ............. *G02B 5/008* (2013.01); *H10K 50/82* (2023.02); *H10K 50/844* (2023.02);
(Continued)

(58) Field of Classification Search
CPC ............................... G02B 5/008; H01K 50/844
See application file for complete search history.

(56) References Cited

U.S. PATENT DOCUMENTS 11,362,310 B2 * 6/2022 Forrest ............... H10K 59/8791
11,581,504 B2 * 2/2023 Kim ..................... H10K 85/615
(Continued)

FOREIGN PATENT DOCUMENTS

| CN | 103715368 A | 4/2014 |
| CN | 106257705 A | 12/2016 |

(Continued)

OTHER PUBLICATIONS

PCT/CN2021/094929 international search report and written opinion.
CN202010455274.5 first office action.

*Primary Examiner* — Joseph L Williams
(74) *Attorney, Agent, or Firm* — IPro, PLLC (57) ABSTRACT

Provided is an encapsulation structure which is applicable for encapsulating an electroluminescent device, and includes: a first inorganic dielectric layer provided with a surface for being attached to a surface of a cathode layer of the electroluminescent device; wherein a dispersion relation among the first inorganic dielectric layer, the cathode layer and an electron injection layer of the electroluminescent device satisfies a preset condition, wherein the preset condition is configured to define an optical parameter of a first interface, the optical parameter is related to dispersion and is configured to couple surface plasmon polaritons (SPPs) on interfaces of two sides of the cathode layer, and the first (Continued)

interface is an interface between the first inorganic dielectric layer and the cathode layer.

20 Claims, 4 Drawing Sheets

(51) Int. Cl.
    *H10K 50/844*     (2023.01)
    *H10K 50/85*     (2023.01)
    *H10K 59/80*     (2023.01)
    *H10K 71/00*     (2023.01)
    *H10K 102/00*     (2023.01)

(52) U.S. Cl.
    CPC ......... *H10K 50/8445* (2023.02); *H10K 50/85* (2023.02); *H10K 59/8731* (2023.02); *H10K 59/879* (2023.02); *H10K 71/00* (2023.02); *H10K 2102/00* (2023.02); *H10K 2102/3026* (2023.02); *H10K 2102/351* (2023.02)

(56) References Cited

U.S. PATENT DOCUMENTS

| | | |
|---|---|---|
| 2015/0380677 A1 | 12/2015 | Wu |
| 2018/0315958 A1 | 11/2018 | Wu et al. |
| 2019/0157620 A1 | 5/2019 | Forrest et al. |
| 2020/0144547 A1 | 5/2020 | Wan et al. |
| 2020/0243719 A1 | 7/2020 | Kristal |

FOREIGN PATENT DOCUMENTS

| | | |
|---|---|---|
| CN | 106992268 A | 7/2017 |
| CN | 107359266 A | 11/2017 |
| CN | 108615752 A | 10/2018 |
| CN | 109671826 A | 4/2019 |
| CN | 110289365 A | 9/2019 |
| CN | 110943113 A | 3/2020 |
| CN | 111584751 A | 8/2020 |
| WO | 2017187166 A2 | 11/2017 |

* cited by examiner

ENCAPSULATION STRUCTURE, ENCAPSULATION METHOD, ELECTROLUMINESCENT DEVICE, AND DISPLAY DEVICE

CROSS-REFERENCE TO RELATED APPLICATION

The present disclosure is a U.S. national stage of international application No. PCT/CN2021/094929, filed on May 20, 2021, which claims priority to Chinese patent application No. 202010455274.5, filed on May 26, 2020 and entitled "ENCAPSULATION STRUCTURE, ENCAPSULATION METHOD, ELECTROLUMINESCENT DEVICE, AND DISPLAY DEVICE", the entire content of which is incorporated herein by reference.

TECHNICAL FIELD

The present disclosure relates to the field of display technologies, and in particular relates to an encapsulation structure, an encapsulation method, an electroluminescent device, and a display device.

BACKGROUND

Organic light-emitting diode (OLED) devices are widely applied in high-end display devices for their advantages of self-luminance, wide viewing angle, almost infinitely high contrast, low power consumption, extremely fast response, and the like.

The OLED devices include top-emitting OLED devices and bottom-emitting OLED devices. In the top-emitting OLED device, a cathode layer is disposed on a light-emitting side of the OLED device.

SUMMARY

The present disclosure provides an encapsulation structure, an encapsulation method, an electroluminescent device, and a display device.

In an aspect, embodiments of the present disclosure provide an encapsulation structure. The encapsulation structure is applicable for encapsulating an electroluminescent device, and the encapsulation structure includes: a first inorganic dielectric layer provided with a surface for being attached to a surface of a cathode layer of the electroluminescent device; wherein a dispersion relation among the first inorganic dielectric layer, the cathode layer and an electron injection layer of the electroluminescent device satisfies a preset condition, wherein the preset condition is configured to define an optical parameter of a first interface, the optical parameter is related to dispersion and is configured to couple surface plasmon polaritons (SPPs) on interfaces of two sides of the cathode layer, and the first interface is an interface between the first inorganic dielectric layer and the cathode layer.

Optionally, the preset condition satisfies the following formula:

$$e^{-4k_1 a} = \frac{\frac{k_1}{\varepsilon_1} + \frac{k_2}{\varepsilon_2}}{\frac{k_1}{\varepsilon_1} - \frac{k_2}{\varepsilon_2}} \times \frac{\frac{k_1}{\varepsilon_1} + \frac{k_3}{\varepsilon_3}}{\frac{k_1}{\varepsilon_1} - \frac{k_3}{\varepsilon_3}},$$

in which, $k_1$ represents a wave vector of light in the cathode layer, in $nm^{-1}$;

$k_2$ represents a wave vector of light in the electron injection layer of the electroluminescent device, in $nm^{-1}$;

$k_3$ represents a wave vector of light in the first inorganic dielectric layer, in $nm^{-1}$;

$\varepsilon_1$ represents a dielectric constant of light in the cathode layer, in $C^2/(N \cdot M^2)$;

$\varepsilon_2$ represents a dielectric constant of light in the electron injection layer of the electroluminescent device, in $C^2/(N \cdot M^2)$;

$\varepsilon_3$ represents a dielectric constant of light in the first inorganic dielectric layer, in $C^2/(N \cdot M^2)$;

a represents a thickness of the cathode layer, in nm; and e represents the dispersion relation.

Optionally, a water vapor transmission rate of the first inorganic dielectric layer is not greater than $1 \times 10^{-4}$ g/m²d.

Optionally, the first inorganic dielectric layer is made from at least one of aluminium oxide, silicon oxide and silicon nitride.

Optionally, a thickness of the first inorganic dielectric layer ranges from 30 nm to 100 nm.

Optionally, the thickness of the first inorganic dielectric layer is 50 nm.

Optionally, the encapsulation structure further includes an organic encapsulation layer and a second inorganic dielectric layer, wherein the organic encapsulation layer is disposed between the first inorganic dielectric layer and the second inorganic dielectric layer, and the first inorganic dielectric layer is disposed between the organic encapsulation layer and the cathode layer.

Optionally, a thickness of the organic encapsulation layer ranges from 4 μm to 20 μm.

Optionally, a thickness of the second inorganic dielectric layer ranges from 50 nm to 2000 nm.

Optionally, the second inorganic dielectric layer is made from at least one of aluminium oxide, silicon oxide and silicon nitride.

Optionally, the first inorganic dielectric layer is manufactured through atomic layer deposition (ALD).

In another aspect, the embodiments of the present disclosure provide an encapsulation method. The encapsulation method includes forming a first inorganic dielectric layer on a surface of a cathode layer of an electroluminescent device:

wherein a dispersion relation among the first inorganic dielectric layer, the cathode layer and an electron injection layer of the electroluminescent device satisfies a preset condition, wherein the preset condition is configured to define an optical parameter of a first interface, the optical parameter is related to dispersion and is configured to couple surface plasmon polaritons (SPPs) on interfaces of two sides of the cathode layer, and the first interface is an interface between the first inorganic dielectric layer and the cathode layer.

Optionally, the preset condition satisfies the following formula:

$$e^{-4k_1 a} = \frac{\frac{k_1}{\varepsilon_1} + \frac{k_2}{\varepsilon_2}}{\frac{k_1}{\varepsilon_1} - \frac{k_2}{\varepsilon_2}} \times \frac{\frac{k_1}{\varepsilon_1} + \frac{k_3}{\varepsilon_3}}{\frac{k_1}{\varepsilon_1} - \frac{k_3}{\varepsilon_3}},$$

in which, $k_1$ represents a wave vector of light in the cathode layer, in $nm^{-1}$;

$k_2$ represents a wave vector of light in the electron injection layer of the electroluminescent device, in nm;

$k_3$ represents a wave vector of light in the first inorganic dielectric layer, in $nm^{-1}$; $\varepsilon_1$ represents a dielectric constant of light in the cathode layer, in $C^2/(N \cdot M^2)$;

$\varepsilon_2$ represents a dielectric constant of light in the electron injection layer of the electroluminescent device, in $C^2/(N \cdot M^2)$;

$\varepsilon_3$ represents a dielectric constant of light in the first inorganic dielectric layer, in $C^2/(N \cdot M^2)$;

a represents a thickness of the cathode layer, in nm; and e represents the dispersion relation.

Optionally, forming the first inorganic dielectric layer on the surface of the cathode layer of the electroluminescent device includes: forming the first inorganic dielectric layer on the surface of the cathode layer of the electroluminescent device through atomic layer deposition (ALD).

Optionally, the encapsulation method further includes: sequentially forming an organic encapsulation layer and a second inorganic dielectric layer on the first inorganic dielectric layer.

In still another aspect, the embodiments of the present disclosure an electroluminescent device. The electroluminescent device includes the encapsulation structure described in any one of the above aspect, and a cathode layer;

wherein a first inorganic dielectric layer of the encapsulation structure is attached to a surface of the cathode layer.

Optionally, the cathode layer is a metal layer.

Optionally, the cathode layer is at least one of an Ag layer, an Mg—Ag laminated layer, an Al—Ag laminated layer, a Cu—Ag laminated layer, and an Al layer.

Optionally, the preset condition satisfies the following formula:

$$e^{-4k_1 a} = \frac{\frac{k_1}{\varepsilon_1} + \frac{k_2}{\varepsilon_2}}{\frac{k_1}{\varepsilon_1} - \frac{k_2}{\varepsilon_2}} \times \frac{\frac{k_1}{\varepsilon_1} + \frac{k_3}{\varepsilon_3}}{\frac{k_1}{\varepsilon_1} - \frac{k_3}{\varepsilon_3}},$$

in which, $k_1$ represents a wave vector of light in the cathode layer, in $nm^{-1}$;

$k_2$ represents a wave vector of light in an electron injection layer of the electroluminescent device, in nm;

$k_3$ represents a wave vector of light in the first inorganic dielectric layer, in $nm^{-1}$;

$\varepsilon_1$ represents a dielectric constant of light in the cathode layer, in $C^2/(N \cdot M^2)$;

$\varepsilon_2$ represents a dielectric constant of light in the electron injection layer of the electroluminescent device, in $C^2/(N \cdot M^2)$;

$\varepsilon_3$ represents a dielectric constant of light in the first inorganic dielectric layer, in $C^2/(N \cdot M^2)$;

a represents a thickness of the cathode layer, in nm; and e represents a dispersion relation.

In still another aspect, the embodiments of the present disclosure provide a display device. The display device includes a power supply component and the electroluminescent device as defined in any one of the above aspect. The power supply component is configured to supply power to the electroluminescent device.

DETAILED DESCRIPTION

In order to further illustrate the technical means and effects adopted in the present disclosure for achieving predetermined invention objectives, the encapsulation structure, the encapsulation method, the electroluminescent device, and the display device provided by the present disclosure, as well as the optional implementations, structures, features, and effects, are described in detail hereinafter with reference to the accompanying drawings and optional embodiments. In the following descriptions, "an embodiment" or "embodiments" do not necessarily refer to the same embodiment. Furthermore, the particular features, structures, or characteristics in one or more embodiments may be combined in any suitable manner.

In the working process of a top-emitting OLED device, since the cathode layer is made of a metal material, light interacts with freely-oscillating electrons on the surface of the cathode layer (also referred to as a metal cathode), thereby producing electron dilatational waves propagating along the surface of the cathode layer. The electron dilatational waves are referred to as surface plasmons (SPs). An electromagnetic wave mode caused by the interaction between light and the free electrons on the surface of the cathode layer is referred to as surface plasmon polaritons (SPPs). During the interaction between light and the free electrons, the free electrons collectively oscillate under the irradiation of light with the same resonance frequency of the free electrons, such that light propagates along the surface of the cathode layer and may not exit from the cathode layer, resulting in loss, which is referred to as loss of SPPs. Due to loss of SPPs, only about 20% of light reaches the outside of the OLED device, resulting in great optical loss. Thus, the optical efficiency of the OLED device is low.

Figure 1:
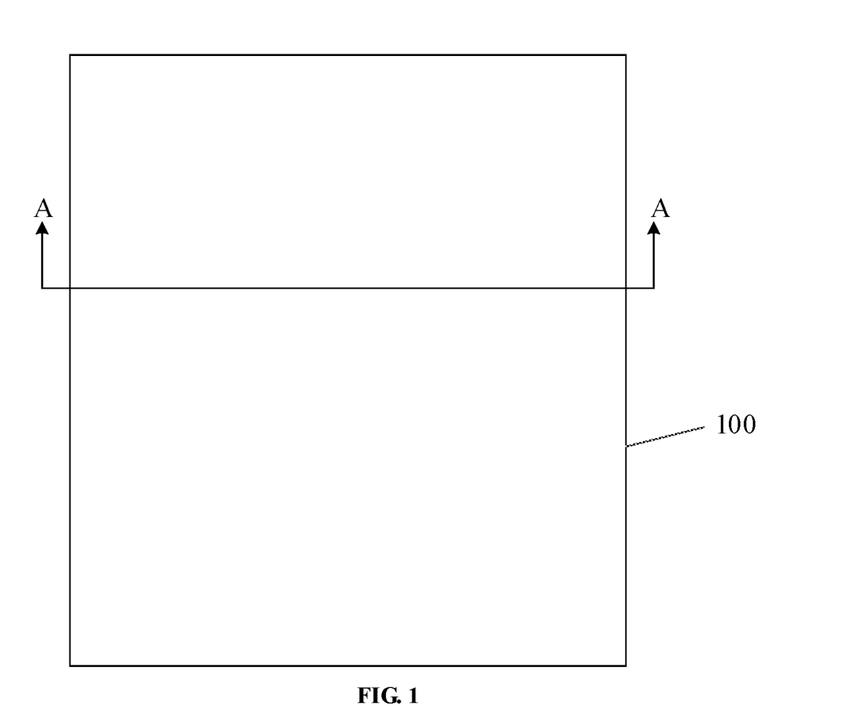
FIG. 1 is a top view of an encapsulation structure according to an embodiment of the present disclosure.

An embodiment of the present disclosure provides an encapsulation structure, applicable for encapsulating an electroluminescent device. FIG. 1 is a top view of an encapsulation structure according to an embodiment of the present disclosure. Referring to FIG. 1, the top view of the encapsulation structure 100 provided by the present disclosure is rectangular. In other implementations, the top view of the encapsulation structure 100 may be in other shapes, which may be adjusted based on the shape of the electroluminescent device.

Figure 2:
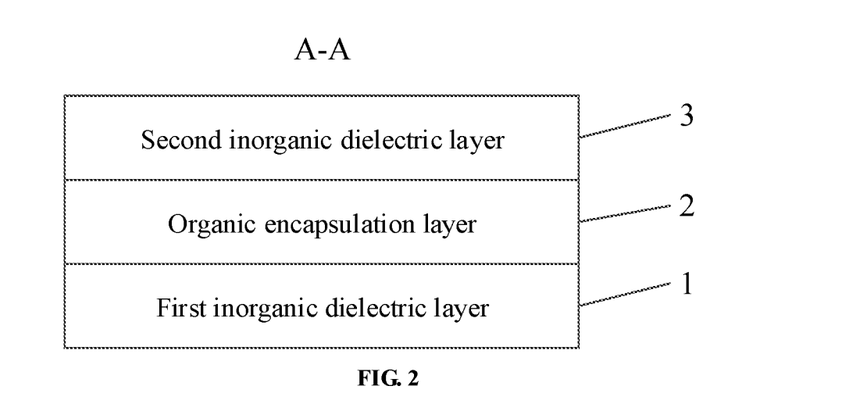
FIG. 2 is a sectional view of a plane A-A in FIG. 1.

FIG. 2 is a sectional view of a plane A-A in FIG. 1. Referring to FIG. 2, the encapsulation structure 100 includes a first inorganic dielectric layer 1. The first inorganic dielectric layer 1 is provided with a surface for being attached to a cathode layer of an electroluminescent device, and the electroluminescent device may be a top-emitting electroluminescent device.

For ease of descriptions, the subsequent embodiments of the present disclosure take an example in which a first interface is an interface between the first inorganic dielectric layer and the cathode layer, and a second interface is an interface between the cathode layer and an electron injection layer.

In the embodiments of the present disclosure, a dispersion relation among the first inorganic dielectric layer, the cathode layer and the electron injection layer of the electroluminescent device satisfies a preset condition. The preset condition is configured to define an optical parameter of the first interface; and the optical parameter is related to chromatic dispersion and is configured to couple SPPs on the interfaces of two sides of the cathode layer. Coupling of the SPPs on the interfaces of the two sides of the cathode layer refers to that the SPPs on the interfaces of the two sides are converted into light by interaction, and that SPs are correspondingly reduced. In this way, the light out-coupling efficiency of the cathode layer can be effectively increased.

Since the dispersion relation among the first inorganic dielectric layer 1, the cathode layer and the electron injection layer of the electroluminescent device satisfies the preset condition, the SPPs on the interfaces (i.e., the first interface and the second interface) of the two sides of the cathode layer may be coupled. In this way, the SPs actually produced on the cathode layer are reduced, thereby reducing loss of the SPPs. Therefore, the amount of light coupled out of the cathode layer is increased, the optical loss is reduced, and efficient light out-coupling is achieved. Thus, the optical efficiency of the top-emitting electroluminescent device is effectively improved.

For example, the optical parameter is configured to match an effective refractive index of the first inorganic dielectric layer 1 with an effective refractive index of the electron injection layer, such that an effective refractive index of the first interface matches with an effective refractive index of the second interface. Thus, the SPPs on the interfaces of the two sides of the cathode layer are coupled. Here, matching the effective refractive index of the first inorganic dielectric layer 1 with the effective refractive index of the electron injection layer refers to that an absolute value of the difference between the effective refractive index of the first inorganic dielectric layer 1 and the effective refractive index of the electron injection layer is smaller than a difference threshold. The smaller the absolute value of the difference between the effective refractive index of the first inorganic dielectric layer 1 and the effective refractive index of the electron injection layer is, the better the effective refractive index of the first inorganic dielectric layer 1 matches with the effective refractive index of the electron injection layer.

Additionally, the SPs of the cathode layer contain all spectral frequencies, such that light of all the spectral frequencies may be coupled so as to exit from the first interface, which further improves the light-emitting efficiency of the electroluminescent device.

The encapsulation structure 100 provided by the embodiment of the present disclosure is configured to encapsulate the top-emitting electroluminescent device. The SPs of the first interface interact with the SPs of the second interface to form an SP coupling mode, such that the SPs are reduced and light lost due to the SPPs is coupled to exit from the first interface, thereby improving the light out-coupling efficiency. To solve the problem of loss of the SPPs caused by the cathode layer of the top-emitting electroluminescent device is to solve the problem of low optical efficiency of the top-emitting electroluminescent device.

Optionally, the first inorganic dielectric layer 1 of the encapsulation structure 100 according to the embodiment of the present disclosure may be directly coated on the surface of the cathode layer through atomic layer deposition (ALD), or other film-forming methods may be adopted for convenience of the actual process, which is not specifically limited in the embodiments of the present disclosure.

Compared with an encapsulation structure in the related art, in the encapsulation structure provided by the embodiment of the present disclosure, the light out-coupling efficiency of the electroluminescent device can be improved by adopting the first inorganic dielectric layer 1, so that the first inorganic dielectric layer 1 plays the role of replacing a capping layer (CPL) and a lithium fluoride (LiF) layer in the related art. Therefore, by replacing the CPL and the LiF layer in the related art with the first inorganic dielectric layer 1 provided by the embodiment of the present disclosure, the electroluminescent device not only has the favorable device optical performance and device reliability, but also the thickness of the thin film layers of the device is effectively reduced, i.e., the thickness of the encapsulation structure 100 is reduced. In addition, since LiF is easily to precipitate moisture to adversely affects the stability of the electroluminescent device, the encapsulation structure 100 provided by the embodiment of the present disclosure avoids the risk of instability caused by LiF to the electroluminescent device and its processes.

In an optional embodiment, the preset condition satisfies the following Formula (1):

$$e^{-4k_1 a} = \frac{\frac{k_1}{\varepsilon_1} + \frac{k_2}{\varepsilon_2}}{\frac{k_1}{\varepsilon_1} - \frac{k_2}{\varepsilon_2}} \times \frac{\frac{k_1}{\varepsilon_1} + \frac{k_3}{\varepsilon_3}}{\frac{k_1}{\varepsilon_1} - \frac{k_3}{\varepsilon_3}} \tag{1}$$

in which, $k_1$ represents a wave vector of light in the cathode layer, in $nm^{-1}$;

$k_2$ represents a wave vector of light in the electron injection layer of the electroluminescent device, in $nm^1$;

$k_3$ represents a wave vector of light in the first inorganic dielectric layer, in $nm^{-1}$;

$\varepsilon_1$ represents a dielectric constant of light in the cathode layer, in $C^2/(N \cdot M^2)$;

$\varepsilon_2$ represents a dielectric constant of light in the electron injection layer of the electroluminescent device, in $C^2/(N \cdot M^2)$;

$\varepsilon_3$ represents a dielectric constant of light in the first inorganic dielectric layer, in $C^2/(N \cdot M^2)$;

a represents a thickness of the cathode layer, in nm; and e represents the dispersion relation.

In the embodiment of the present disclosure, the encapsulation structure in the related art and the encapsulation structure in the present disclosure are adopted to encapsulate the electroluminescent devices separately, and then the two electroluminescent devices are tested. A computer is used to simulate the SPs on the interfaces of the two sides of the cathode layer and the light out-coupling efficiencies of the electroluminescent devices. According to the simulation of the SPs on the interfaces of the two sides of the cathode layer by using the computer, under the circumstance that the dispersion relation among the first inorganic dielectric layer 1, the cathode layer and the electron injection layer of the top-emitting electroluminescent device satisfies Formula (1), the more the dielectric constant of light of the electron injection layer of the top-emitting electroluminescent device approximates the dielectric constant of light of the first inorganic dielectric layer 1, the better the coupling effect generated by the first inorganic dielectric layer 1 is, that is, the better the light out-coupling effect is. Additionally, it can be seen from the simulation result that the thinner the cathode layer is, the better the coupling effect generated by the first inorganic dielectric layer 1 is, that is, the better the light out-coupling effect is. Therefore, on the basis of satisfying the above condition, to improve the light-emitting efficiency, the cathode layer may be made as thin as possible, and the dielectric constant of light in the electron injection layer of the top-emitting electroluminescent device may approximate the dielectric constant of light in the first inorganic dielectric layer 1.

In the embodiment of the present disclosure, the thickness of the first inorganic dielectric layer 1 ranges from 30 nm to 100 nm.

In the experiment of simulation, when the encapsulation structure 100 in the present disclosure is adopted, the first inorganic dielectric layers 1 of different thicknesses are also adopted as one layer in the encapsulation structure 100. According to the computer simulation of the SPs on the interfaces of the two sides of the cathode layer, it can be known that when the first inorganic dielectric layer 1 satisfies the requirement on thickness, the first inorganic dielectric layer 1 generates a better coupling effect, and the light out-coupling effect is better; and the thinner the cathode layer is, the better the coupling effect generated by the first inorganic dielectric layer 1 is, and the better the light out-coupling effect is.

In the experiment of simulation, the SPPs of the first interface are referred to as SPP1, and the SPPs of the second interface are referred to as SPP2. The electron injection layer and the cathode layer of electroluminescent device are unchanged, so SPP2 is unchanged. SPP1 may be adjusted such that SPP1 approximates SPP2. In this case, the amount of coincident light between the two upper and lower interfaces of the cathode layer is increased. It can be seen from the experimental figure that SPP1 is nearly 100 times SPP2. The power of the SPP1 is increased when the thickness of the first inorganic dielectric layer 1 increases to 45 nm. The situation that SPs are coupled to SPP1 always exists when the thickness of the first inorganic dielectric layer 1 is further increased. This shows how the degree of matching between the effective refractive indexes of media on the two sides of the cathode layer promotes energy to pass through the cathode layer. With existence of the first inorganic dielectric layer 1 and increase of the effective refractive index on the upper side of a silver/air interface, the frequency of SPP1 decreases, which makes SPP1 approximate SPP2, thereby improving the light-emitting efficiency.

In addition, it can be found from the experiment that with the increase of the thickness of the first inorganic dielectric layer 1, the coupling degree changes from weak to strong and tends to be stable after the thickness of the first inorganic dielectric layer 1 becomes 45 nm. The increased energy comes from the recovered loss of SPP1. When the thickness of the first inorganic dielectric layer 1 is 45 nm, i.e., when the effective refractive indexes of the media on the two sides of the cathode layer best match with each other, the coupling degree is maximal. In this case, light is scattered by the rough surface of the cathode layer, such that the light out-coupling efficiency of the electroluminescent device is improved.

In the experiment of lighting up the electroluminescent device encapsulated by the encapsulation structure in the present disclosure and the electroluminescent device encapsulated by the encapsulation structure in the related art at the humidity of 85% and the temperature of 85° C., it is found that the luminance of the electroluminescent device encapsulated by the encapsulation structure in the present disclosure is obviously higher.

Light lost due to the SPs of the cathode layer accounts for 40% of total light, and the light lost due to the SPs of the cathode layer may be coupled out by the encapsulation structure 100 provided by the embodiments of the present disclosure. Therefore, the encapsulation structure 100 provided by the embodiments of the present disclosure can increase the light out-coupling efficiency by 40%.

In an embodiment of the present disclosure, an optional thickness of the first inorganic dielectric layer 1 is 50 nm. In other embodiments, the thickness may also be selected appropriately based on the material of the first inorganic dielectric layer 1.

In an optional embodiment, the water vapor transmission rate of the first inorganic dielectric layer 1 does not exceed $1 \times 10^{-4}$ g/m$^2$d.

Optionally, the first inorganic dielectric layer 1 not only needs to be able to achieve the light out-coupling effect, but also needs to have the characteristic of an encapsulation layer, i.e., water resistance, to ensure the encapsulation effect of the encapsulation structure 100. Therefore, the water vapor transmission rate of the first inorganic dielectric layer 1 should not exceed $1 \times 10^{-4}$ g/m$^2$d. Optionally, the first inorganic dielectric layer 1 with different water vapor transmission rates may be acquired by adjusting the compactness and the material of the first inorganic dielectric layer 1.

The encapsulation structure 100 provided by the embodiments of the present disclosure has certain water and oxygen resistance while the light out-coupling efficiency is improved.

Optionally, the first inorganic dielectric layer 1 provided by the embodiments of the present disclosure may be made from any inorganic dielectric material suitable for manufacturing an encapsulation film layer.

For example, the first inorganic dielectric layer 1 is optionally made from one of aluminum oxide ($Al_2O_3$), silicon oxide ($SiO_2$) and silicon nitride ($SiN$), or a mixture of two or three of these materials.

Referring to FIG. 1 again, the encapsulation structure 100 further includes an organic encapsulation layer 2 and a second inorganic dielectric layer 3. The organic encapsulation layer 2 is disposed between the first inorganic dielectric layer 1 and the second inorganic dielectric layer 3, and the first inorganic dielectric layer 1 is disposed between the cathode layer and the organic encapsulation layer 2.

The first inorganic dielectric layer 1, the organic encapsulation layer 2 and the second inorganic dielectric layer 3 together form the encapsulation structure 100, thereby ensuring the encapsulation effect of the encapsulation structure 100.

In an embodiment of the present disclosure, the material of the organic encapsulation layer 2 may be selected with reference to the thin film encapsulation technology in the related art. For the thickness and film forming method of the organic encapsulation layer 2, a reference may also be made to the thin film encapsulation technology in the related art.

For example, the organic encapsulation layer 2 may be an ink jet printing (IJP) layer.

In an embodiment of the present disclosure, the material of the second inorganic dielectric layer 3 may be the same as or different from the material of the first inorganic dielectric layer 1, as long as the material is an inorganic dielectric material that may be used for encapsulating the electroluminescent device. The film-forming method of the second inorganic dielectric layer 3 may be any one of evaporation, ALD, coating and the like; and the thickness of the second inorganic dielectric layer 3 only needs to ensure a sufficient waterproof function.

For example, the second inorganic dielectric layer 3 is optionally made from one of $Al_2O_3$, $SiO_2$ and SiN or a mixture of two or three of these materials.

In an optional embodiment, the thickness of the organic encapsulation layer 2 is greater than or equal to 4 μm and less than or equal to 20 μm, to ensure that the organic encapsulation layer 2 is leveled; and the thickness of the second inorganic dielectric layer 3 is greater than or equal to 50 nm and less than or equal to 2000 nm. For example, the thickness of the organic encapsulation layer 2 is 8 μm, and the thickness of the second inorganic dielectric layer 3 is 50 nm.

Optionally, the thickness of the organic encapsulation layer 2 and the thickness of the second inorganic dielectric layer 3 may be appropriately selected based on the materials thereof, but it should be ensured that the thickness of the organic encapsulation layer 2 ranges from 4 μm to 20 μm and the thickness of the second inorganic dielectric layer 3 ranges from 50 nm to 2000 nm.

An embodiment of the present disclosure provides an encapsulation method. The method includes: forming a first inorganic dielectric layer on a surface of a cathode layer of an electroluminescent device. A dispersion relation among the first inorganic dielectric layer, the cathode layer and an electron injection layer of the electroluminescent device satisfies a preset condition. The preset condition is configured to define an optical parameter of a first interface; and the optical parameter is related to chromatic dispersion and is configured to couple SPPs on interfaces of two sides of the cathode layer.

Optionally, the preset condition satisfies the following Formula (1):

$$e^{-4k_1 a} = \frac{\frac{k_1}{\varepsilon_1} + \frac{k_2}{\varepsilon_2}}{\frac{k_1}{\varepsilon_1} - \frac{k_2}{\varepsilon_2}} \times \frac{\frac{k_1}{\varepsilon_1} + \frac{k_3}{\varepsilon_3}}{\frac{k_1}{\varepsilon_1} - \frac{k_3}{\varepsilon_3}} \quad (1)$$

in which, $k_1$ represents a wave vector of light in the cathode layer, in $nm^{-1}$;

$k_2$ represents a wave vector of light in the electron injection layer of the electroluminescent device, in $nm^{-1}$;

$k_3$ represents a wave vector of light in the first inorganic dielectric layer, in nm;

$\varepsilon_1$ represents a dielectric constant of light in the cathode layer, in $C^2/(N \cdot M^2)$;

$\varepsilon_2$ represents a dielectric constant of light in the electron injection layer of the electroluminescent device, in $C^2/(N \cdot M^2)$;

$\varepsilon_3$ represents a dielectric constant of light in the first inorganic dielectric layer, in $C^2/(N \cdot M^2)$;

a represents a thickness of the cathode layer, in nm; and e represents the dispersion relation.

Optionally, the water vapor transmission rate of the first inorganic dielectric layer does not exceed $1 \times 10^{-4}$ $g/m^2 d$, to ensure the water and oxygen resistance of the first inorganic dielectric layer.

The first inorganic dielectric layer may be prepared through ALD, and the specific preparation process is known to technical persons and thus is not repeated in the present disclosure.

Figure 3:
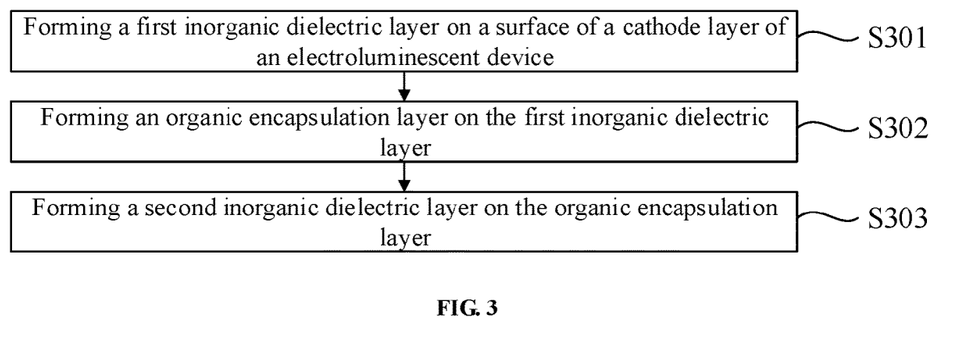
FIG. 3 is a flowchart of a method for manufacturing an encapsulation structure according to an embodiment of the present disclosure.

FIG. 3 is a flowchart of a method for manufacturing an encapsulation structure according to an embodiment of the present disclosure. Referring to FIG. 3, the method includes the following steps.

In step S301, a first inorganic dielectric layer is formed on a surface of a cathode layer of an electroluminescent device.

In step S302, an organic encapsulation layer is formed on the first inorganic dielectric layer.

In step S303, a second inorganic dielectric layer is formed on the organic encapsulation layer.

In the embodiment of the present disclosure, the organic encapsulation layer and the second inorganic dielectric layer may be prepared through ALD described above, or through evaporation, coating, or the like, which is not limited in the present disclosure.

Figure 4:
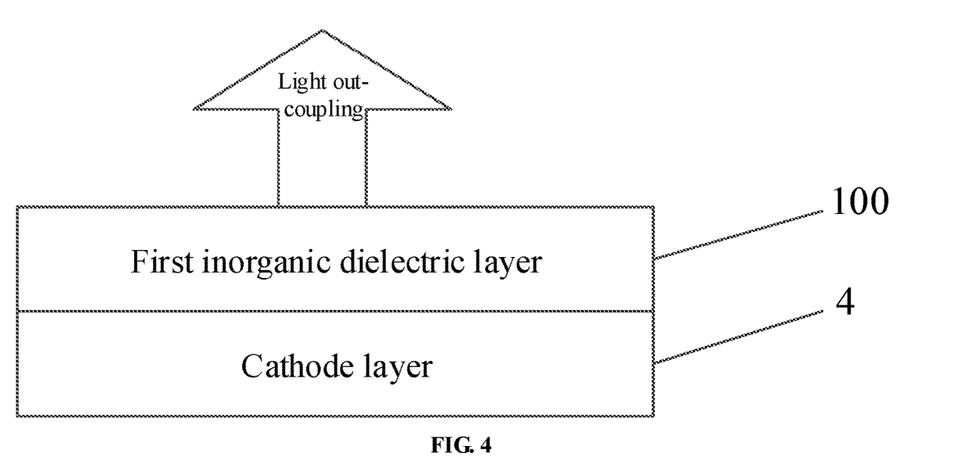
FIG. 4 is a schematic structural diagram of an electroluminescent device according to an embodiment of the present disclosure.

FIG. 4 is a schematic structural diagram of an electroluminescent device according to an embodiment of the present disclosure. Referring to FIG. 4, the electroluminescent device includes a cathode layer 4 and the encapsulation structure 100 described above. The first inorganic dielectric layer of the encapsulation structure 100 is attached to a surface of the cathode layer 4 of the electroluminescent device. The electroluminescent device in the embodiment of the present disclosure may be a top-emitting electroluminescent device.

Figure 5:
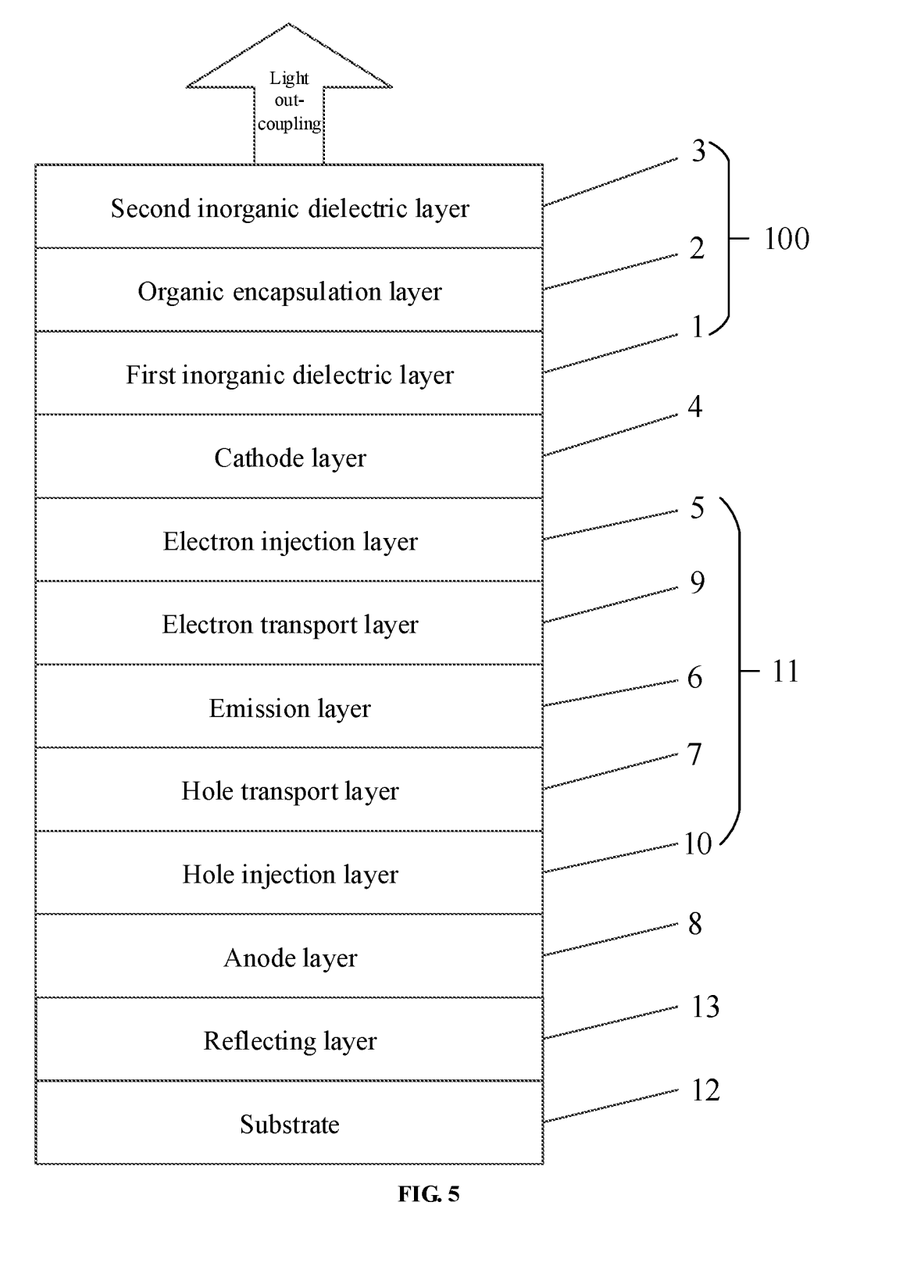
FIG. 5 is a schematic structural diagram of an electroluminescent device according to an embodiment of the present disclosure.

FIG. 5 is a schematic structural diagram of an electroluminescent device according to an embodiment of the present disclosure. Referring to FIG. 5, the electroluminescent device further includes following functional layers disposed under the first inorganic dielectric layer 1: a cathode layer 4, an organic light-emitting layer 11 and an anode layer 8. The organic light-emitting layer 11 includes an electron injection layer 5, an electron transport layer 9, an emission layer 6, a hole transport layer 7, and a hole injection layer 10.

Optionally, the hole injection layer 10 may be a molybdenum trioxide ($MoO_3$) layer.

Optionally, the thickness of the hole injection layer 10 ranges from 8 nm to 15 nm.

Optionally, the hole transport layer 7 may be made from a tetraphenylbenzidine derivative (NPD).

Optionally, the thickness of the hole transport layer 7 ranges from 30 nm to 50 nm.

Optionally, the emission layer 6 may be made from CBP:5% IR(ppy)3.

Optionally, the thickness of the emission layer 6 ranges from 15 nm to 25 nm.

Optionally, the electron transport layer 9 may be made from Bphen.

Optionally, the thickness of the electron transport layer 9 ranges from 8 nm to 15 nm.

Optionally, the electron injection layer 5 may be made from Bphen:Li.

Optionally, the thickness of the electron injection layer 5 ranges from 10 nm to 25 nm.

The encapsulation structure may be directly the encapsulation structure described above.

For its specific implementation structure, reference may be made to the related contents described in the embodiments of the encapsulation structure 100, which is not repeated herein.

Optionally, the electroluminescent device further includes a substrate 12. The anode layer 8 is disposed between the substrate 12 and the hole injection layer 10. The substrate 12 supports the anode layer 8 and structures disposed on the anode layer 8.

For example, the substrate 12 may be a glass substrate, a polyimide substrate, or the like.

In an implementation of the embodiments of the present disclosure, the cathode layer 4 is a metal layer, so as to ensure the conductivity of the cathode layer 4.

For example, the cathode layer 4 is at least one of an Ag layer, an Mg—Ag laminated layer, an Al—Ag laminated layer, a Cu—Ag laminated layer, and an Al layer.

In other implementations, the cathode layer 4 may also be other conductive metal layers.

Optionally, the thickness of the cathode layer 4 ranges from 10 nm to 15 nm.

In an implementation of the embodiments of the present disclosure, the anode layer 8 may be an indium tin oxide (ITO) layer, and the surface resistivity of the ITO layer is less than 30 $\omega \cdot m^2$, so as to ensure the conductivity of the anode layer 8.

In other implementations, the anode layer 8 may also be other conductive layers.

Optionally, the thickness of the anode layer 8 ranges from 8 nm to 15 nm.

In an implementation of the embodiments of the present disclosure, a reflecting layer 13 may be disposed on a side of the anode layer 8 distal from the cathode layer 4, and the reflecting layer 13 is disposed between the anode layer 8 and the substrate 12. When light in the emission layer 6 irradiates the reflecting layer 13, the reflecting layer 13 reflects the light to improve the light out-coupling efficiency.

For example, the reflecting layer 13 may be an Ag layer, and the thickness of the reflecting layer 13 ranges from 80 nm to 120 nm. For example, the thickness of the reflecting layer 13 is 100 nm.

Figure 6:
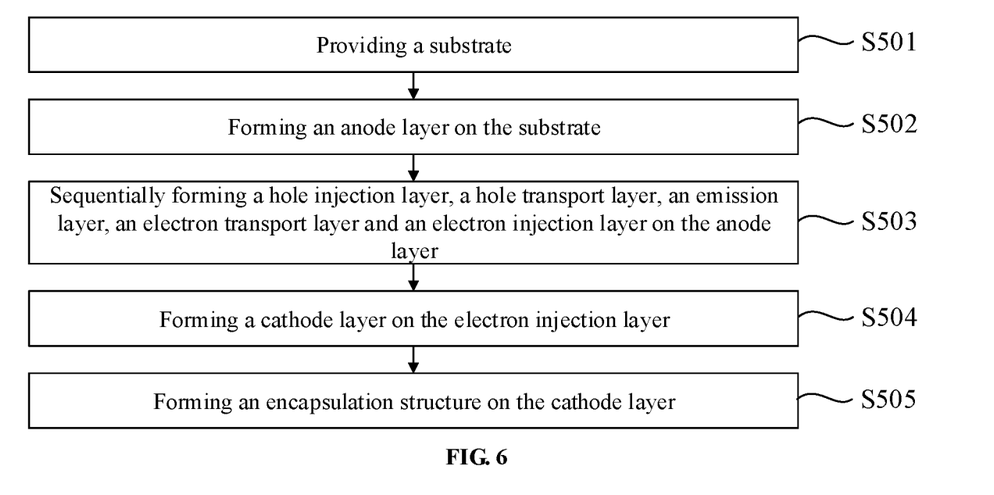
FIG. 6 is a flowchart of a method for manufacturing an electroluminescent device according to an embodiment of the present disclosure.

An embodiment of the present disclosure further provides a method for manufacturing an electroluminescent device. FIG. 6 is a flowchart of a method for manufacturing an electroluminescent device according to an embodiment of the present disclosure. Referring to FIG. 6, the method includes the following steps.

In step S501, a substrate is provided.

In step S502, an anode layer is formed on the substrate.

In the embodiment of the present disclosure, a substrate with an anode layer may be formed by photoetching a transparent glass substrate containing ITO.

For example, after photoetching is completed, the substrate with the anode layer is cleaned in an ultrasonic environment of deionized water, acetone and absolute ethyl alcohol, and then blow-dried with nitrogen ($N_2$) and subjected to oxygen ($O_2$) plasma treatment, to remove impurities on the surfaces of the substrate and the anode layer.

In step S503, a hole injection layer, a hole transport layer, an emission layer, an electron transport layer and an electron injection layer are sequentially formed on the anode layer.

In the embodiment of the present disclosure, the hole injection layer, the hole transport layer, the emission layer, the electron transport layer and the electron injection layer are all formed through thermal evaporation, and the chamber vacuum degree is $3 \times 10^{-6}$ Torr, and the evaporation rate keeps from 0.8 Å/s to 1.2 Å/s during thermal evaporation.

The hole injection layer, the hole transport layer, the electron transport layer and the electron injection layer are evaporated by using an open mask, and the emission layer is evaporated by using a fine metal mask.

In step S504, a cathode layer is formed on the electron injection layer.

In the embodiment of the present disclosure, the cathode layer is formed through thermal evaporation, and the evaporation rate of the cathode layer is controlled to range from 3 Å/s to 4 Å/s.

In step S505, an encapsulation structure is formed on the cathode layer.

For example, an area to be encapsulated is covered with a glass cover plate, a UV curing adhesive is applied around the glass cover plate, and the glass cover plate is placed under a UV lamp of 265 nm for irradiation for 20 min to 25 min.

Optionally, a layer of aluminum may be deposited on the cathode layer 4 first, the deposition rate of aluminum is controlled to range from 0.2 nm/s to 0.4 nm/s, and aluminum is deposited by using a fine metal mask.

After aluminum reacts with oxygen to form aluminum oxide and the aluminum oxide becomes the first inorganic dielectric layer, the organic encapsulation layer is formed on the first inorganic dielectric layer. The evaporation rate of the organic encapsulation layer is controlled to range from 0.05 nm/s to 0.15 nm/s, and the organic encapsulation layer is evaporated by using an open mask. Then, the second inorganic dielectric layer is formed on the organic encapsulation layer.

An embodiment of the present disclosure provides a display device. The display device includes a power supply component and an electroluminescent device. The electroluminescent device is the electroluminescent device described above, and the power supply component is configured to supply power to the electroluminescent device.

The display device provided by the embodiment of the present disclosure may be a liquid crystal display device, an organic light-emitting diode display device, a quantum dot display device, or the like. In specific implementation, the display device provided by the embodiment of the present disclosure may be any product or component having a display function, such as a mobile phone, a tablet computer, a television, a display, a notebook computer, a digital photo frame or a navigator.

The above descriptions are merely optional embodiments of the present disclosure, and are not intended to limit the present disclosure in any form. Any simple amendments, equivalent variations and modifications made to the above embodiments according to the technical essence of the present disclosure shall fall within the scope of the technical solutions of the present disclosure.

What is claimed is:

1. An encapsulation structure, applicable for encapsulating an electroluminescent device, the encapsulation structure comprising:
    a first inorganic dielectric layer provided with a surface for being attached to a surface of a cathode layer of the electroluminescent device;
    wherein a dispersion relation among the first inorganic dielectric layer, the cathode layer and an electron injection layer of the electroluminescent device satisfies a preset condition, wherein the preset condition is configured to define an optical parameter of a first interface, the optical parameter is related to dispersion and is configured to couple surface plasmon polaritons (SPPs) on interfaces of two sides of the cathode layer, and the first interface is an interface between the first inorganic dielectric layer and the cathode layer.

2. The encapsulation structure according to claim 1, wherein the preset condition satisfies the following formula:

$$e^{-4k_1 a} = \frac{\frac{k_1}{\varepsilon_1} + \frac{k_2}{\varepsilon_2}}{\frac{k_1}{\varepsilon_1} - \frac{k_2}{\varepsilon_2}} \times \frac{\frac{k_1}{\varepsilon_1} + \frac{k_3}{\varepsilon_3}}{\frac{k_1}{\varepsilon_1} - \frac{k_3}{\varepsilon_3}},$$

in which, $k_1$ represents a wave vector of light in the cathode layer, in $nm^{-1}$;

$k_2$ represents a wave vector of light in the electron injection layer of the electroluminescent device, in $nm^{-1}$;

$k_3$ represents a wave vector of light in the first inorganic dielectric layer, in $nm^{-1}$;

$\varepsilon_1$ represents a dielectric constant of light in the cathode layer, in $C^2/(N \cdot M^2)$;

$\varepsilon^2$ represents a dielectric constant of light in the electron injection layer of the electroluminescent device, in $C^2/(N \cdot M^2)$;

$\varepsilon^3$ represents a dielectric constant of light in the first inorganic dielectric layer, in $C^2/(N \cdot M^2)$;

a represents a thickness of the cathode layer, in nm; and e represents the dispersion relation.

3. The encapsulation structure according to claim 1, wherein a water vapor transmission rate of the first inorganic dielectric layer is not greater than $1 \times 10^{-4}$ g/m² d.

4. The encapsulation structure according to claim 1, wherein the first inorganic dielectric layer is made from at least one of aluminium oxide, silicon oxide and silicon nitride.

5. The encapsulation structure according to claim 1, wherein a thickness of the first inorganic dielectric layer ranges from 30 nm to 100 nm.

6. The encapsulation structure according to claim 5, wherein the thickness of the first inorganic dielectric layer is 50 nm.

7. The encapsulation structure according to claim 1, further comprising an organic encapsulation layer and a second inorganic dielectric layer, wherein the organic encapsulation layer is disposed between the first inorganic dielectric layer and the second inorganic dielectric layer, and the first inorganic dielectric layer is disposed between the organic encapsulation layer and the cathode layer.

8. The encapsulation structure according to claim 7, wherein a thickness of the organic encapsulation layer ranges from 4 μm to 20 μm.

9. The encapsulation structure according to claim 7, wherein a thickness of the second inorganic dielectric layer ranges from 50 nm to 2000 nm.

10. The encapsulation structure according to claim 7, wherein the second inorganic dielectric layer is made from at least one of aluminium oxide, silicon oxide and silicon nitride.

11. The encapsulation structure according to claim 1, wherein the first inorganic dielectric layer is manufactured through atomic layer deposition (ALD).

12. An encapsulation method, comprising:

forming a first inorganic dielectric layer on a surface of a cathode layer of an electroluminescent device;

wherein a dispersion relation among the first inorganic dielectric layer, the cathode layer and an electron injection layer of the electroluminescent device satisfies a preset condition, wherein the preset condition is configured to define an optical parameter of a first interface, the optical parameter is related to dispersion and is configured to couple surface plasmon polaritons (SPPs) on interfaces of two sides of the cathode layer, and the first interface is an interface between the first inorganic dielectric layer and the cathode layer.

13. The encapsulation method according to claim 12, wherein the preset condition satisfies the following formula:

$$e^{-4k_1 a} = \frac{\frac{k_1}{\varepsilon_1} + \frac{k_2}{\varepsilon_2}}{\frac{k_1}{\varepsilon_1} - \frac{k_2}{\varepsilon_2}} \times \frac{\frac{k_1}{\varepsilon_1} + \frac{k_3}{\varepsilon_3}}{\frac{k_1}{\varepsilon_1} - \frac{k_3}{\varepsilon_3}},$$

in which, $k_1$ represents a wave vector of light in the cathode layer, in $nm^{-1}$;

$k_2$ represents a wave vector of light in the electron injection layer of the electroluminescent device, in $nm^{-1}$;

$k_3$ represents a wave vector of light in the first inorganic dielectric layer, in $nm^{-1}$;

$\varepsilon_1$ represents a dielectric constant of light in the cathode layer, in $C^2/(N \cdot M^2)$;

$\varepsilon_2$ represents a dielectric constant of light in the electron injection layer of the electroluminescent device, in $C^2/(N \cdot M^2)$;

$\varepsilon_3$ represents a dielectric constant of light in the first inorganic dielectric layer, in $C^2/(N \cdot M^2)$;

a represents a thickness of the cathode layer, in nm; and e represents the dispersion relation.

14. The encapsulation method according to claim 12, wherein forming the first inorganic dielectric layer on the surface of the cathode layer of the electroluminescent device comprises:

forming the first inorganic dielectric layer on the surface of the cathode layer of the electroluminescent device through atomic layer deposition (ALD).

15. The encapsulation method according to claim 12, further comprising:

sequentially forming an organic encapsulation layer and a second inorganic dielectric layer on the first inorganic dielectric layer.

16. An electroluminescent device, comprising the encapsulation structure and a cathode layer;

wherein a first inorganic dielectric layer of the encapsulation structure is attached to a surface of the cathode layer, the encapsulation structure which is applicable for encapsulating the electroluminescent device comprises:

a first inorganic dielectric layer provided with a surface for being attached to a surface of the cathode layer of the electroluminescent device; wherein a dispersion relation among the first inorganic dielectric layer, the cathode layer and an electron injection layer of the electroluminescent device satisfies a preset condition, wherein the preset condition is configured to define an optical parameter of a first interface, the optical parameter is related to dispersion and is configured to couple surface plasmon polaritons (SPPs) on interfaces of two sides of the cathode layer, and the first interface is an interface between the first inorganic dielectric layer and the cathode layer.

17. The electroluminescent device according to claim 16, wherein the cathode layer is a metal layer.

18. The electroluminescent device according to claim 17, wherein the cathode layer is at least one of an Ag layer, an Mg—Ag laminated layer, an Al—Ag laminated layer, a Cu—Ag laminated layer, and an Al layer.

19. The electroluminescent device according to claim 16, wherein the preset condition satisfies the following formula:

$$e^{-4k_1 a} = \frac{\frac{k_1}{\varepsilon_1} + \frac{k_2}{\varepsilon_2}}{\frac{k_1}{\varepsilon_1} - \frac{k_2}{\varepsilon_2}} \times \frac{\frac{k_1}{\varepsilon_1} + \frac{k_3}{\varepsilon_3}}{\frac{k_1}{\varepsilon_1} - \frac{k_3}{\varepsilon_3}},$$

in which, $k_1$ represents a wave vector of light in the cathode layer, in $nm^{-1}$;

$k_2$ represents a wave vector of light in an electron injection layer of the electroluminescent device, in $nm^{-1}$;

$k_3$ represents a wave vector of light in the first inorganic dielectric layer, in $nm^{-1}$;

$\varepsilon_1$ represents a dielectric constant of light in the cathode layer, in $C^2/(N \cdot M^2)$;

$\varepsilon_2$ represents a dielectric constant of light in the electron injection layer of the electroluminescent device, in $C^2/(N \cdot M^2)$;

$\varepsilon_3$ represents a dielectric constant of light in the first inorganic dielectric layer, in $C^2/(N \cdot M^2)$;

a represents a thickness of the cathode layer, in nm; and e represents a dispersion relation.

20. A display device, comprising a power supply component and the electroluminescent device as defined in claim 16, wherein the power supply component is configured to supply to the electroluminescent device.

* * * * *